United States Patent
Sarig et al.

(10) Patent No.: US 7,609,093 B2
(45) Date of Patent: Oct. 27, 2009

(54) COMPARATOR WITH LOW SUPPLY CURRENT SPIKE AND INPUT OFFSET CANCELLATION

(75) Inventors: Erez Sarig, Migdal Haemek (IL); Raz Reshef, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 11/833,803

(22) Filed: Aug. 3, 2007

(65) Prior Publication Data
US 2009/0033370 A1    Feb. 5, 2009

(51) Int. Cl.
*H03K 5/22* (2006.01)
(52) U.S. Cl. .............................. 327/65; 327/66; 327/72; 330/252; 330/253
(58) Field of Classification Search .................. 327/65, 327/66, 72, 560–563; 330/252, 253
See application file for complete search history.

(56) References Cited

U.S. PATENT DOCUMENTS

| | | | | |
|---|---|---|---|---|
| 5,070,259 A | | 12/1991 | Rempfer et al. | |
| 5,307,067 A | * | 4/1994 | Kimura et al. | 341/159 |
| 5,471,169 A | * | 11/1995 | Dendinger | 327/563 |
| 5,532,626 A | * | 7/1996 | Khayat | 327/53 |
| 5,563,598 A | * | 10/1996 | Hickling | 341/155 |
| 5,614,852 A | * | 3/1997 | Giordano et al. | 327/63 |
| 5,623,220 A | * | 4/1997 | Betti et al. | 327/79 |
| 5,801,657 A | * | 9/1998 | Fowler et al. | 341/155 |
| 5,900,748 A | * | 5/1999 | Miyama et al. | 327/65 |
| 5,969,546 A | * | 10/1999 | Hamanishi et al. | 327/67 |
| 6,208,187 B1 | * | 3/2001 | Callahan, Jr. | 327/206 |
| 6,310,571 B1 | * | 10/2001 | Yang et al. | 341/155 |
| 6,518,909 B1 | * | 2/2003 | Yang et al. | 341/155 |
| 6,535,030 B1 | * | 3/2003 | Nix | 327/65 |
| 6,542,105 B2 | * | 4/2003 | Sakuragi | 341/164 |
| 6,617,887 B2 | * | 9/2003 | Nix | 327/65 |
| 6,788,237 B1 | * | 9/2004 | Bidermann et al. | 341/155 |
| 6,859,762 B2 | * | 2/2005 | Mawet | 702/189 |
| 7,053,670 B2 | * | 5/2006 | Muto et al. | 327/65 |
| 7,145,494 B2 | * | 12/2006 | Mizuguchi et al. | 341/155 |
| 7,236,019 B2 | * | 6/2007 | Cowles et al. | 327/108 |
| 7,279,940 B1 | * | 10/2007 | Min | 327/95 |
| 7,301,391 B2 | * | 11/2007 | Jaussi et al. | 327/552 |
| 7,304,599 B2 | * | 12/2007 | Lee | 341/169 |
| 7,408,138 B2 | * | 8/2008 | Lee | 250/208.1 |
| 2005/0179470 A1 | * | 8/2005 | Neaves | 327/72 |

FOREIGN PATENT DOCUMENTS

JP    10107600 A * 4/1998

* cited by examiner

*Primary Examiner*—Lincoln Donovan
*Assistant Examiner*—Adam D Houston
(74) *Attorney, Agent, or Firm*—Bever, Hoffman & Harms, LLP; E. Eric Hoffman

(57) ABSTRACT

A current control circuit is coupled in parallel with the current paths of a differential comparator circuit to ensure that a substantially constant current is drawn from a current source during all operating phases of a comparator. The current control circuit is biased by a reference voltage, which is also used to bias a V− input terminal of the differential comparator circuit. The reference voltage is stored by a sample capacitor, which is charged by applying the reference voltage to a V+ input terminal of the differential comparator circuit while coupling an output terminal of the differential comparator circuit to the sample capacitor in a unity feedback configuration.

18 Claims, 4 Drawing Sheets

COMPARATOR WITH LOW SUPPLY CURRENT SPIKE AND INPUT OFFSET CANCELLATION

BACKGROUND OF THE INVENTION

1. Field of the Invention

The present invention relates to a comparator structure for use in high accuracy applications such as analog to digital converters (ADC).

2. Related Art

Comparators are often used in high accuracy applications, such as analog-to-digital conversion. In these applications, quiet high and low voltage supplies are required to achieve low supply noise. However, many known comparators have large current spikes on one or both voltage supplies during output transitions. These current spikes can interfere with chip operation. For example, an image sensor chip may include many column-parallel comparators, each having an output that switches when an input ramp signal reaches a reference level. If the outputs of many comparators transition at the same time, large current spikes may exist on the $V_{DD}$ or ground rails, thereby creating significant noise that may adversely impact comparators having outputs that have not yet transitioned.

FIG. 1 is a circuit diagram of a conventional differential comparator 100, exhibits a large current spike when the output of the comparator changes state. Differential comparator 100 includes PMOS transistors 101-102, NMOS transistors 103-104, output capacitor 105 and current source 110. PMOS transistors 101 and 102 form a simple differential input pair, which is connected to the active load formed by NMOS transistors 103 and 104 and capacitor 105. The gate of PMOS transistor 101 is configured to receive a ramp voltage V+, and the gate of PMOS transistor 102 is configured to receive a reference voltage V−. As the ramp voltage V+ rises from ground level to the $V_{DD}$ supply voltage, the supply current (I) provided by current source 110 changes in the manner described below.

When the ramp voltage V+ is less than the reference voltage V−, current flows through PMOS transistor 101, and current source 110 provides a maximum current. When the ramp voltage V+ reaches or exceeds the reference voltage V−, no current flows through PMOS transistor 101. At this time, current will flow through PMOS transistor 102 until the output voltage $V_{OUT}$ of the comparator increases to $V_{DD}$. At this time, PMOS transistor 102 and current source 110 stop charging capacitor 105 and current flow through PMOS transistor 102 stops. Thus, the current drawn by comparator 100 transitions from a maximum current (when V+ is less than V−) to zero current (when V+ exceeds V−). Some comparators attempt to limit this current transition by connecting the gate of NMOS transistor 104 to a constant bias voltage. However, even in these comparators, the supply current transitions from a maximum current to a current equal to one half of the maximum current.

U.S. Pat. No. 5,070,259, issued to Rempfer et al., describes an amplifier stage for use in a comparator, wherein the amplifier stage draws a substantially continuous supply current for different values of input voltage. However, this amplifier stage undesirably exhibits a relatively low gain, requiring a large number of amplifier stages to be connected in series in order to provide an adequate gain. In addition, an input capacitor and an output capacitor must be connected in the signal path of the series-connected amplifier stages.

It would therefore be desirable to have a comparator that does not experience current spikes on either the $V_{DD}$ or ground supplies during output transitions of the comparator. It would further be desirable if such a comparator does not require an overly complicated structure, a large number of circuit elements, or capacitors connected in the signal path. It would further be desirable for such a comparator to have an input offset cancellation option.

SUMMARY

Accordingly, the present invention provides a comparator that includes a differential comparator and a current control circuit connected in parallel with the differential comparator. In one embodiment, the current control circuit comprises a pair of transistors connected in series between a $V_{DD}$ supply terminal and a ground supply terminal. The current control circuit draws a current in parallel with the differential comparator, such that the total current drawn by the differential comparator and the current control circuit remains relatively constant across transitions in the output of the comparator.

The present invention will be more fully understood in view of following description and drawings.

DETAILED DESCRIPTION

Figure 1:
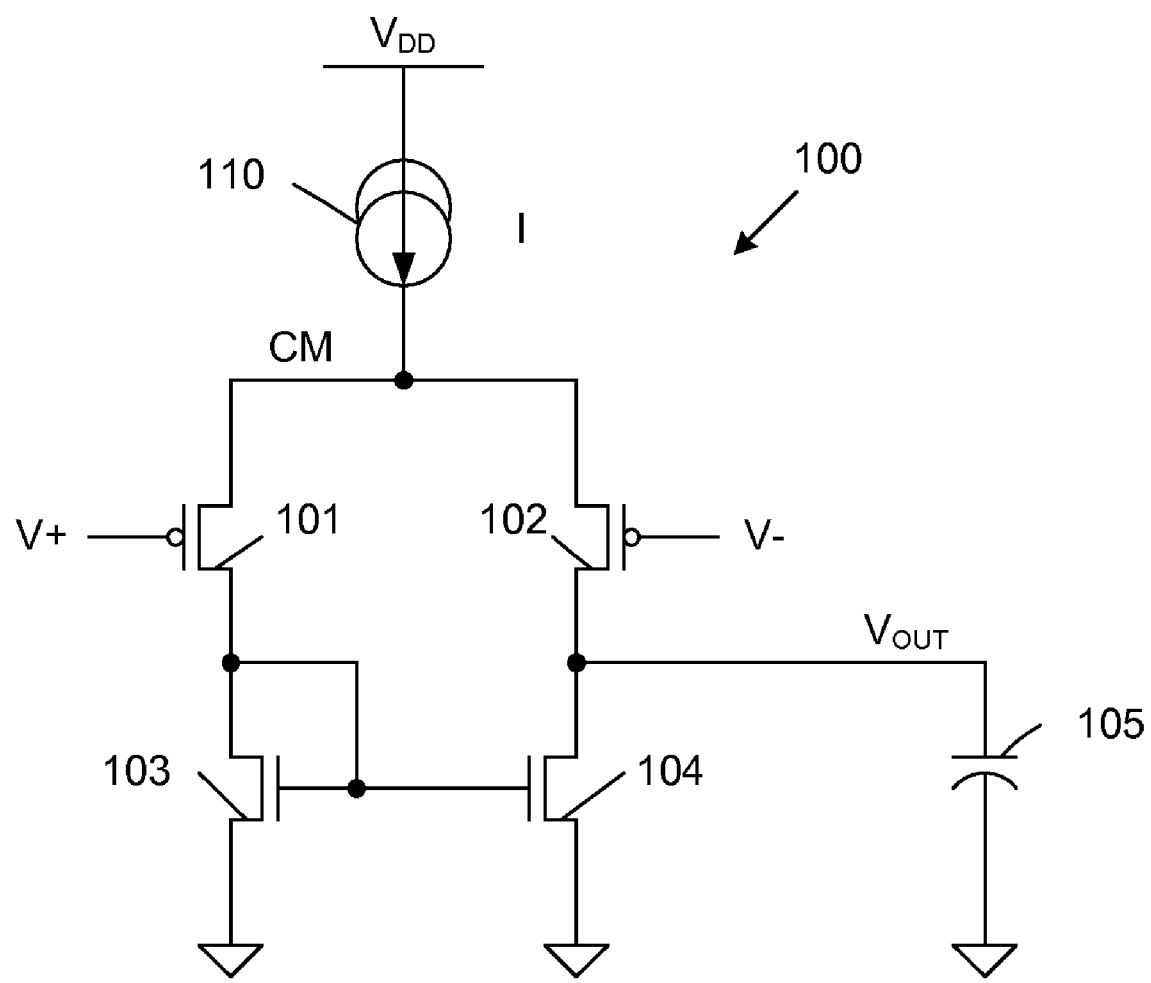
FIG. 1 is a circuit diagram of a conventional comparator.
Figure 2:
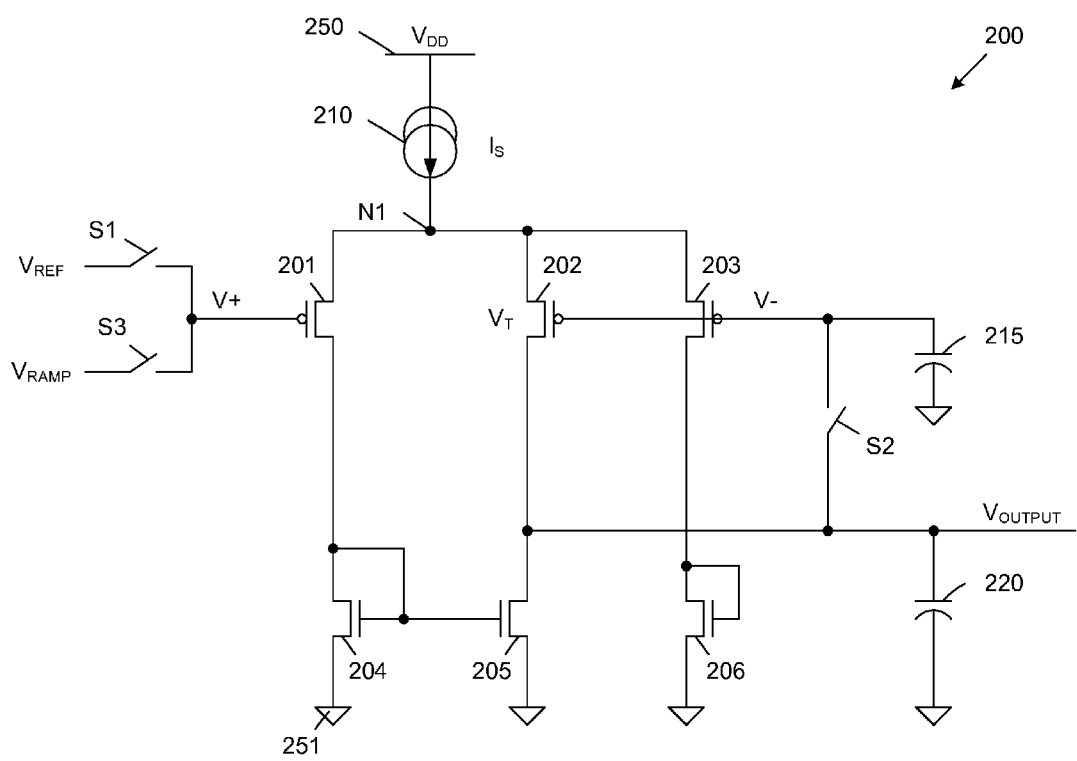
FIG. 2 is a circuit diagram of a comparator in accordance with one embodiment of the present invention.

FIG. 2 is a circuit diagram of a comparator 200 in accordance with one embodiment of the present invention. Comparator 200 includes PMOS transistors 201-203, NMOS transistors 204-206, current source 210, sample capacitor 215, output capacitor 220 and switches S1-S3. Comparator 200 is supplied by a $V_{DD}$ voltage supply 250 and a ground voltage supply 251. These voltage supplies 250-251 effectively form a current source 210, which provides a source current ($I_S$) to node N1.

As described in more detail below, PMOS transistors 201-202 and NMOS transistors 204-205 form a differential comparator circuit, which provides an output voltage ($V_{OUTPUT}$) in response to the voltages (V+, V−) applied to the gates of PMOS transistors 201 and 202. PMOS transistor 203 and NMOS transistor 206 form a current control circuit, which is coupled in parallel with the current paths of the differential comparator circuit, and ensures that a substantially constant current is drawn from current source 210 during all operating phases of comparator 200.

The sources of PMOS transistors 201-203 are commonly connected to node N1, such that these transistors receive the source current $I_S$ provided by current source 210. The drains of PMOS transistors 201-203 are coupled to the drains of NMOS transistors 204-206, respectively. The sources of NMOS transistors 204-206 are commonly coupled to the ground supply 251. The drain of NMOS transistor 204 is also coupled to the gates of NMOS transistors 204 and 205. Similarly, the drain of NMOS transistor 206 is connected to the gate of NMOS transistor 206.

The gate of PMOS transistor 201 is coupled to switches S1 and S3. Switch S1 is further coupled to receive a reference voltage $V_{REF}$, and switch S3 is further coupled to receive a ramp voltage $V_{RAMP}$. The gates of PMOS transistors 202-203 are commonly coupled to a first terminal of sample capacitor 215. The second terminal of sample capacitor 215 is coupled to the ground supply 251. The drains of PMOS transistor 202 and NMOS transistor 205 are commonly coupled to the first terminal of output capacitor 220 (i.e., the comparator output terminal). The second terminal of output capacitor 220 is coupled to ground supply 251. Switch S2 is coupled between the first terminals of sample capacitor 215 and output capacitor 220.

PMOS transistor 203 and NMOS transistor 206 provide a current path from $V_{DD}$ to ground, enabling the source current $I_S$ provided by current source 210 to remain constant during transitions in the output voltage $V_{OUTPUT}$.

PMOS transistor 203 acts as a voltage clamp to maintain the voltage on node N1 at a level lower than the sum of the input voltage V− and the threshold voltage ($V_{TP}$) of PMOS transistor 202. NMOS transistor 206 maintains a symmetrical source current flow when the input voltage V+ reaches (or exceeds) the input voltage V−. This configuration allows comparator 200 to be connected in a unity feedback configuration to cancel any input offsets.

Figure 3A:
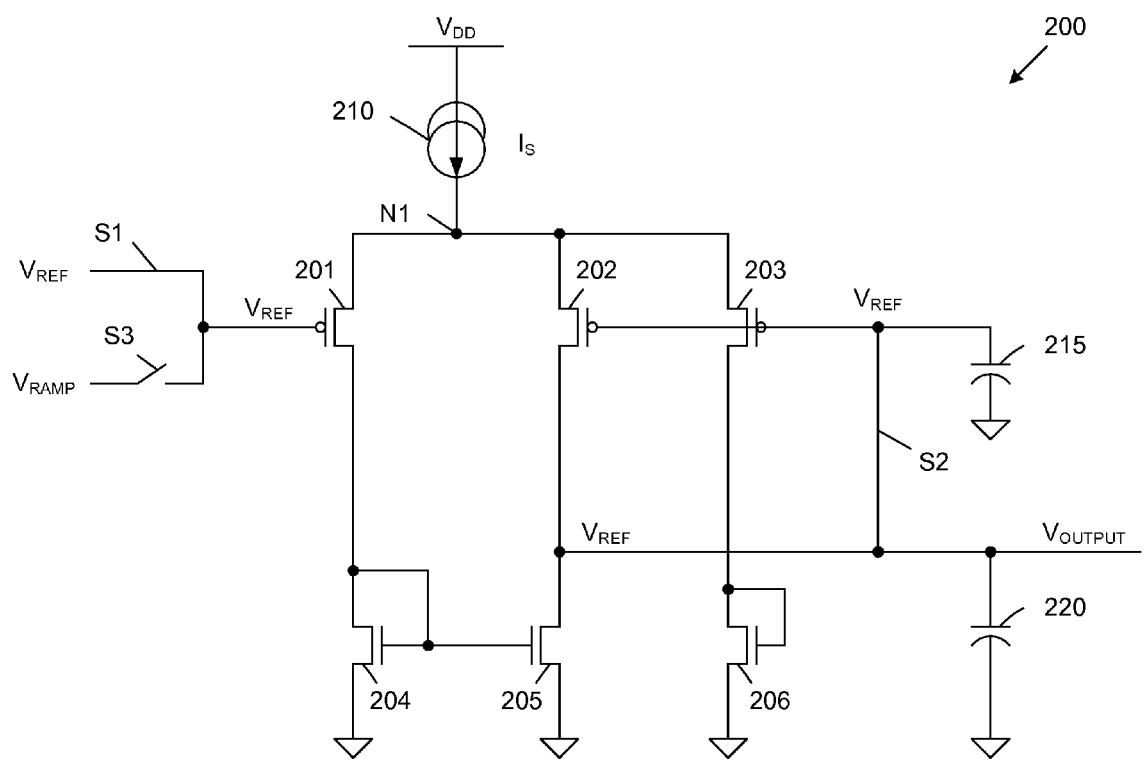
FIGS. 3A and 3B are circuit diagrams of the comparator of FIG. 2 during different operating phases in accordance with one embodiment of the present invention.
Figure 3B:
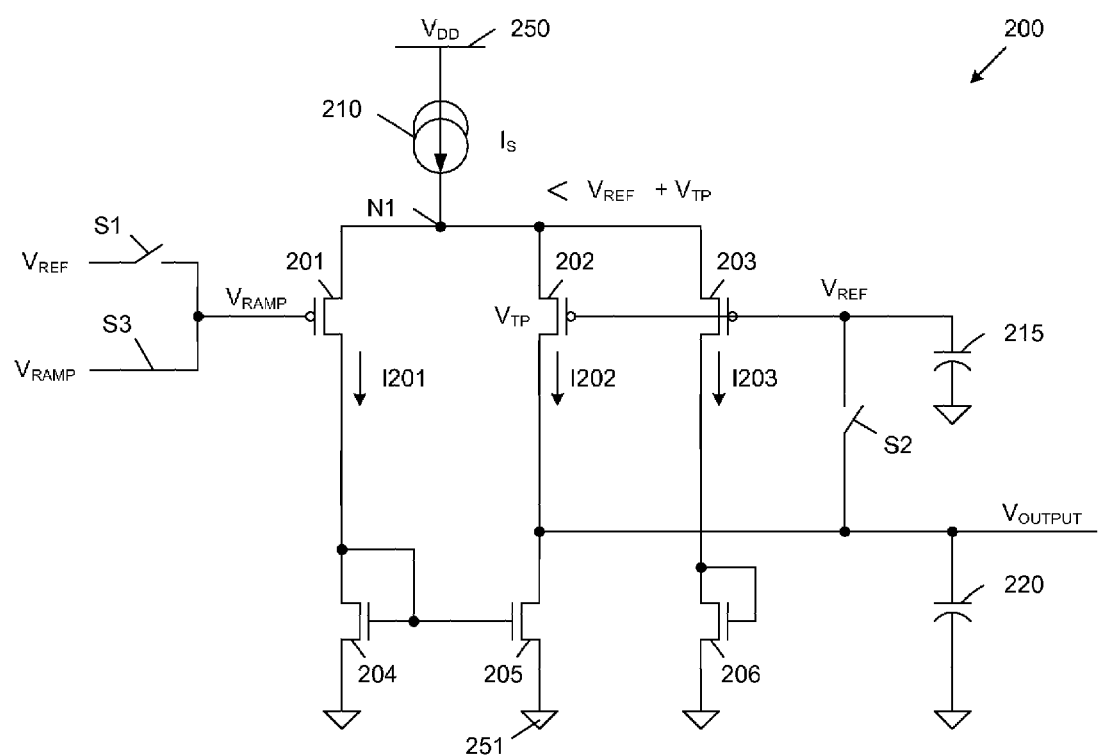

The operation of comparator 200 will now be described in more detail. FIGS. 3A and 3B are circuit diagrams illustrating the two operating phases of comparator 200 in accordance with one embodiment of the present invention.

FIG. 3A illustrates a first operating phase of comparator 200, wherein switches S1 and S2 are closed (conductive) and switch S3 is open (non-conductive). Under these conditions, a reference voltage $V_{REF}$ is applied to the gate of PMOS transistor 201. In response, sample capacitor 215 charges until the voltage applied to the gate of PMOS transistor 202 is equal to the reference voltage $V_{REF}$ (i.e., the input voltage V− is equal to the reference voltage $V_{REF}$). Stated another way, the reference voltage $V_{REF}$ is sampled on the first terminal of sample capacitor 215 (as well as the first terminal of output capacitor 220). In one embodiment, the reference voltage $V_{REF}$ may be a predetermined voltage. In another embodiment, the reference voltage $V_{REF}$ may be representative of a pixel value.

During the first operating phase illustrated by FIG. 3A, the source current $I_S$ flows through PMOS transistors 201-203. If PMOS transistors 201-203 are all the same size, and NMOS transistors 204-206 are all the same size, then the same current (i.e., $I_S/3$) will flow through PMOS transistors 201, 202 and 203 during the first operating phase.

FIG. 3B illustrates a second operating phase of comparator 200, wherein switches S1 and S2 are open (non-conductive) and switch S3 is closed (conductive). Under these conditions, an increasing single-slope ramp voltage $V_{RAMP}$ is applied to the gate of PMOS transistor 201. In one embodiment, the ramp voltage $V_{RAMP}$ starts at ground (0 Volts) and linearly increases to a voltage equal to the $V_{DD}$ supply voltage. In another embodiment, the ramp voltage $V_{RAMP}$ starts from a voltage representative of a pixel value. When switch S2 is opened, sample capacitor 215 continues to apply the sampled reference voltage $V_{REF}$ to the gates of PMOS transistors 202 and 203. Because the ramp voltage signal $V_{RAMP}$ is initially less than the sampled reference voltage $V_{REF}$, the output voltage $V_{OUTPUT}$ is pulled down to ground via NMOS transistor 205, and no current flows through PMOS transistor 202.

While the ramp voltage $V_{RAMP}$ is less than the reference voltage $V_{REF}$, the source current $I_S$ flows only through PMOS transistor 201. When the ramp voltage $V_{RAMP}$ reaches the reference voltage $V_{REF}$, the source current $I_S$ flows through all of PMOS transistors 201-203 equally.

When the ramp voltage $V_{RAMP}$ exceeds the reference voltage $V_{REF}$, the source current $I_S$ initially flows through PMOS transistors 202 and 203 equally. The current flowing through PMOS transistor 202 charges output transistor 220, thereby increasing the output voltage $V_{OUTPUT}$. As the output voltage $V_{OUTPUT}$ rises, the current flow through PMOS transistor 202 decreases, thereby increasing the current flow through PMOS transistor 203. When the output voltage $V_{OUTPUT}$ reaches a voltage equal to the reference voltage $V_{REF}$ plus the threshold voltage of PMOS transistor 202, current no longer flows through PMOS transistor 202, and the entire source current $I_S$ flows through PMOS transistor 203.

Advantageously, the unity feedback configuration of FIG. 3A (wherein the reference voltage $V_{REF}$ applied to the gate of PMOS transistor 201 is fed back to the gates of PMOS transistors 202-203) in combination with the application of the ramp voltage $V_{RAMP}$ of FIG. 3B (wherein the ramp voltage $V_{RAMP}$ is applied to the gate of PMOS transistor 201) effectively cancels any input offset exhibited by comparator 200.

Current spikes associated with comparator 200 are reduced approximately 100 times, when compared with a conventional comparator structure. Comparator 200 advantageously reduces current spikes from the $V_{DD}$ voltage supply 250 and the ground supply 251 by adding only two transistors 203 and 206 to a conventional comparator structure. Thus, the improvements are achieved at a relatively low cost in terms of increased layout area.

Comparator 200 can advantageously be replicated many times in an analog to digital converter, such as a column parallel global ramp ADC in an image sensor, while maintaining quiet power supplies. In addition, comparator 200 advantageously does not require capacitors in the signal path.

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:

1. A comparator comprising:
    a current source that provides a source current to a first node;
    a first voltage supply terminal configured to receive a first supply voltage;
    a first transistor coupled between the first node and the first voltage supply terminal along a first current path;
    a second transistor coupled between the first node and the first voltage supply terminal along a second current path;
    a third transistor coupled between the first node and the first voltage supply terminal along a third current path, wherein the first, second and third current paths are separate and parallel current paths between the first node and the first voltage supply terminal;
    a first input terminal configured to receive a first differential input signal of the comparator, wherein the first input terminal is coupled to a gate of the first transistor;
    a second input terminal configured to receive a second differential input signal of the comparator, wherein the second input terminal is coupled to gates of the second and third transistors;
    a first capacitor coupled between the second input terminal and the first voltage supply terminal, wherein the first capacitor applies the second differential input signal to the comparator; and
    means for sampling the first differential input signal on the first capacitor.

2. A comparator comprising:
    a current source that provides a source current to a first node;

a first voltage supply terminal configured to receive a first supply voltage;

a first transistor coupled between the first node and the first voltage supply terminal along a first current path;

a second transistor coupled between the first node and the first voltage supply terminal along a second current path;

a third transistor coupled between the first node and the first voltage supply terminal along a third current path, wherein the first, second and third current paths are separate and parallel current paths between the first node and the first voltage supply terminal;

a first input terminal configured to receive a first differential input signal of the comparator, wherein the first input terminal is coupled to a gate of the first transistor;

a second input terminal configured to receive a second differential input signal of the comparator, wherein the second input terminal is coupled to gates of the second and third transistors;

a first capacitor coupled between the second input terminal and the first voltage supply terminal, wherein the first capacitor applies the second differential input signal to the comparator;

an output terminal configured to receive an output signal of the comparator, wherein the output terminal is coupled to a drain of the second transistor; and a switch coupled between the output terminal and the second input terminal.

3. The comparator of claim 2, further comprising an output capacitor coupled between the output terminal and the first voltage supply terminal.

4. The comparator of claim 1, wherein the first, second and third transistors are PMOS transistors.

5. The comparator of claim 1, further comprising:

a fourth transistor coupling the first transistor to the first voltage supply terminal; and a fifth transistor coupling the second transistor to the first voltage supply terminal, wherein the fourth and fifth transistors have gates commonly coupled to a drain of the fourth transistor.

6. The comparator of claim 5, further comprising:

an output terminal coupled to a drain of the fifth transistor; and an output capacitor coupled to the output terminal.

7. The comparator of claim 5, further comprising a sixth transistor coupling the third transistor to the first voltage supply terminal.

8. A method of implementing a comparator comprising:

sampling a reference voltage applied to a first input of a differential comparator circuit on a second input of the differential comparator circuit during a first operating phase; and then maintaining the reference voltage on the second input of the differential comparator circuit and an input of a current control circuit during a second operating phase, wherein the current control circuit provides a current path in parallel with current paths of the differential comparator circuit; and applying a ramp voltage to the first input of the differential comparator circuit during the second operating phase.

9. The method of claim 8, wherein the step of sampling the reference voltage comprises coupling the second input of the differential comparator circuit to an output terminal of the differential comparator circuit.

10. The method of claim 9, wherein the step of sampling the reference voltage comprises storing charge on a sampling capacitor coupled to the second input of the differential comparator circuit.

11. The method of claim 8, wherein current flows through the differential comparator circuit and the current control circuit during the first operating phase.

12. The method of claim 11, wherein a current flowing through the differential comparator circuit is about twice a current flowing through the current control circuit during the first operating phase.

13. The method of claim 8, wherein current only flows through the differential comparator circuit during the second operating phase while the ramp voltage is less than the reference voltage.

14. The method of claim 8, wherein current flows through both the differential comparator circuit and the current control circuit during the second operating phase while the ramp voltage is equal to the reference voltage.

15. The method of claim 8, wherein current initially flows through both the differential comparator circuit and the current control circuit during the second operating phase, when the ramp voltage initially exceeds the reference voltage, and wherein current subsequently flows only through the current control circuit during the second operating phase, after the ramp voltage exceeds the reference voltage by a predetermined voltage.

16. The method of claim 8, wherein a current flowing through the differential comparator circuit and the current control circuit during the first operating phase is substantially equal to a current flowing through the differential comparator circuit and the current control circuit during the second operating phase.

17. The method of claim 16, wherein the current flowing through the differential comparator circuit and the current control circuit is substantially constant during the second operating phase.

18. The method of claim 8, wherein a current flowing through the differential comparator circuit and the current control circuit is substantially constant during the second operating phase.

* * * * *